United States Patent
Fukushima et al.

(10) Patent No.: US 6,658,637 B2
(45) Date of Patent: Dec. 2, 2003

(54) SEMICONDUCTOR DEVICE TRIMMING METHOD, SEMICONDUCTOR DEVICE TRIMMING APPARATUS, AND METHOD FOR CREATING SEMICONDUCTOR DEVICE TRIMMING TABLE

(75) Inventors: Yasuhiko Fukushima, Tokyo (JP); Masakazu Tanaka, Tokyo (JP); Yoshihiro Higashigawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 126 days.

(21) Appl. No.: 09/760,638

(22) Filed: Jan. 17, 2001

(65) Prior Publication Data

US 2002/0035718 A1 Mar. 21, 2002

(30) Foreign Application Priority Data

Jul. 21, 2000 (JP) ........................................ 2000-220608

(51) Int. Cl.7 ............................................... G06F 17/50
(52) U.S. Cl. ............................................ 716/16; 716/4
(58) Field of Search ........................................ 716/16, 4

(56) References Cited

U.S. PATENT DOCUMENTS 5,528,372 A * 6/1996 Kawashima ................ 356/401
5,905,681 A * 5/1999 Matsui .................... 365/189.08
6,108,804 A * 8/2000 Derner ........................ 324/416
6,349,240 B2 * 2/2002 Ogawa et al. ................ 438/15

FOREIGN PATENT DOCUMENTS

JP          8-161385     *   6/1996  .......... G06F/17/50

* cited by examiner

Primary Examiner—Vuthe Siek
Assistant Examiner—Brandon Bowers
(74) Attorney, Agent, or Firm—McDermott, Will & Emery

(57) ABSTRACT

A semiconductor device trimming method or apparatus is proposed for use with a semiconductor device which includes at least a regular cell array, a spare cell array, a fuse array, and a spare decoder. In the method or apparatus, a trimming table is prepared which lists all address modes of address signals for row or column address lines to be replaced in the regular cell array and the blow mode of the fuse array corresponding to each of the address modes. Then, fuses are selectively blown in the fuse array according to the blow mode corresponding to row or column lines of which the selection has been inhibited in the regular cell array in accordance with the trimming table. The spare decoder inhibits selection of cells in the regular cell array and permit selection of cells on the spare lines in the spare cell array in order to replace the inhibited row or column lines in the regular cell array.

7 Claims, 9 Drawing Sheets

Fig. 5

Code : *, *, *, *, *, *, *, *, SP, X3, X2, X1, X0, *, *, *, * ······ repair code 23

Trimmer : A ······ apparatus 150

MSB: [*][*][*][*][*][*][*][SP][X3][X2][X1][X0][*][*][*][*] :LSB

*not used example of repair code
X30Y15 : 0020
X31Y15 : 0000
X40Y20 : 0030, 01F0 chip coordinate on wafer    repair code of chip

SEMICONDUCTOR DEVICE TRIMMING METHOD, SEMICONDUCTOR DEVICE TRIMMING APPARATUS, AND METHOD FOR CREATING SEMICONDUCTOR DEVICE TRIMMING TABLE

BACKGROUND OF THE INVENTION

1. Field of the Invention

The present invention relates to a method and an apparatus for trimming a semiconductor device which comprises at least a regular cell array, a spare cell array, a spare cell decoder for inhibiting selection of a plurality of cells on at least one row or column line in a regular cell array and for replacing the selected cells with a plurality of cells on at least one spare line in a spare cell array, and a fuse array including a plurality of fuses connected to the spare decoder. The present invention further relates to a method for creating a trimming table for use with the trimming method and apparatus.

2. Background Art

Many semiconductor devices such as memories generally comprise spare cell arrays in addition to their regular cell arrays. A spare cell array has at least one spare line and is used to replace a plurality of cells on at least one row or column line in a regular cell array that has failed.

The above type of semiconductor device comprises spare decoders and fuse arrays besides the regular and spare cell arrays. A spare decoder inhibits selection of a plurality of cells on a faulty row or column line in a regular cell array, and permits selection of a row or a column line in a spare cell array. A fuse array has a plurality of fuses, and generates command signals telling a spare decoder to inhibit selection of a regular cell array and to select a spare cell array in accordance with blow modes of the multiple fuses.

The blow modes of a fuse array correspond to blow patterns of a plurality of fuses included in that fuse array. As such, the blow modes correspond to address modes of an address signal for prompting selection of a row or a column line containing a faulty cell in a regular cell array.

In processes for fabricating the above type of semiconductor device, a trimming apparatus is used to blow a plurality of fuses in a given fuse array according to desired blow modes. Designed to blow fuses using laser in general, this apparatus is called a laser trimming apparatus. Of a plurality of fuses, only those designated are blown by the trimming apparatus. With conventional methods and apparatuses for trimming currently in use, it takes considerable time and effort to prepare programs for designating fuses to be blown.

Generally, tests performed on a semiconductor device yield data about faulty cells in its regular cell arrays. From the faulty cell data, addresses of rows or columns containing the faulty cells are derived. Blow modes corresponding to address modes of the addresses are obtained. Programs describing these specifics are then prepared manually.

A method improving on such conventional procedures is proposed illustratively by Japanese Patent Laid-open No. Hei 8-161385. The proposed method involves using a computer in support of writing programs. Because it includes special steps to name fuses in keeping with fuse layout data, the method remains fairly complicated.

SUMMARY OF THE INVENTION

It is therefore an object of the present invention to provide a novel semiconductor device trimming method for trimming fuse arrays in a more simplified and generalized fashion than before.

It is another object of the present invention to provide an improved semiconductor device trimming apparatus for trimming fuse arrays in a more simplified and generalized manner.

It is a further object of the present invention to provide an innovative method for creating in a more simplified and generalized fashion a semiconductor device trimming table that is used to trim fuse arrays.

According to one aspect of the present invention, a semiconductor device trimming method is proposed for use with a semiconductor device. The semiconductor device includes a regular cell array, first and address lines, a spare cell array, a fuse array and a spare decoder. A regular cell array has a plurality of cells arranged in a matrix constituted by a plurality of first lines and by a plurality of second lines intersecting the first lines. First address lines select cells on each of the first lines in the regular cell array, and second address lines selects cells on each of the second lines in the regular cell array. A spare cell array has a plurality of cells arranged on at least one spare line corresponding to the first lines. A fuse array includes a plurality of fuses. A spare decoder is connected to the fuse array, and inhibits selection of cells on at least one of the first lines in the regular cell array in accordance with blow modes of the fuse array, and permit selection of cells on at least one of the spare lines in the spare cell array in order to replace the inhibited first line.

The semiconductor device trimming method is used selectively to blow fuses so as to impart the blow modes to the fuse array. In the semiconductor device trimming method, a trimming table is prepared which lists all address modes of address signals for the first address lines and the blow mode of the fuse array corresponding to each of the address modes. Then, fuses in the fuse array are selectively blown according to the blow mode corresponding to at least one of the first lines of which the selection has been inhibited in the regular cell array in accordance with the trimming table.

According to another aspect of the present invention, a semiconductor device trimming apparatus comprises storing means for storing a trimming table which lists all address modes of address signals for said first address lines and the blow mode of said fuse array corresponding to each of the address modes. The trimming apparatus further comprises blowing means for selectively blowing fuses in said fuse array in the blow mode corresponding to at least one of said first lines of which the selection has been inhibited in said regular cell array in accordance with said trimming table.

According to another aspect of the present invention, in a trimming table creating method, outputs of a logic circuits included in said spare decoder is monitored. Thereby, a trimming table is prepared which lists all address modes of address signals for said first address lines and the blow mode of said fuse array corresponding to each of the address modes.

Other features and advantages of the invention will be apparent from the following description taken in connection with the accompanying drawings.

BRIEF DESCRIPTION OF THE DRAWINGS

FIG. 5 is an explanatory view of program creating rules for use by the inventive semiconductor device trimming method;

DETAILED DESCRIPTION OF THE PREFERRED EMBODIMENTS

First Embodiment

Figure 1:
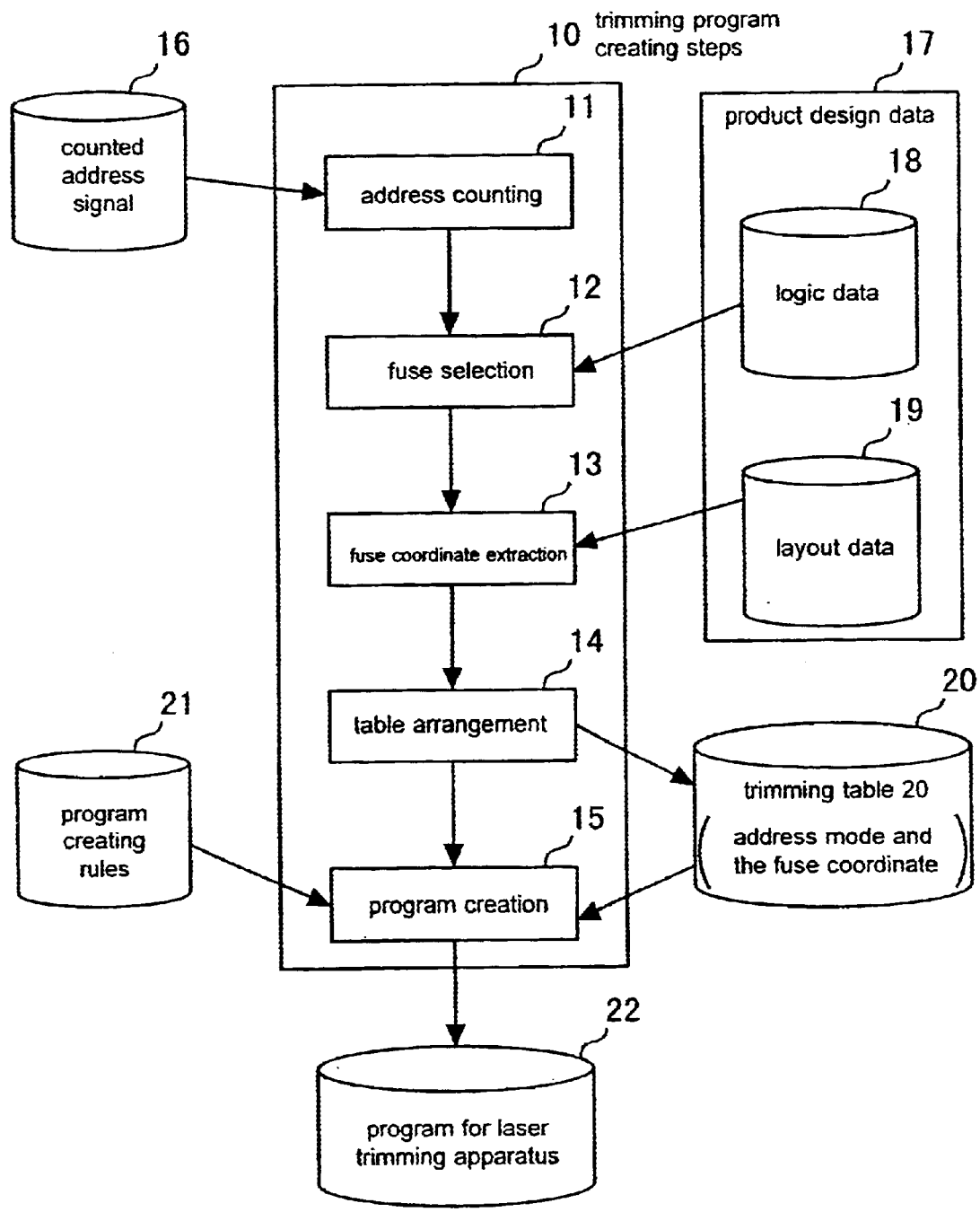
FIG. 1 is a flowchart of steps constituting a semiconductor device trimming method practiced as a first embodiment of this invention.

FIG. 1 is a flowchart of steps constituting a semiconductor device trimming method practiced as the first embodiment of the present invention. The trimming method is executed in a computer-supported manner and involves blowing designated fuses in a fuse array of a semiconductor device that has a regular cell array, spare cell array, spare decoder, and fuse array.

Figure 9:
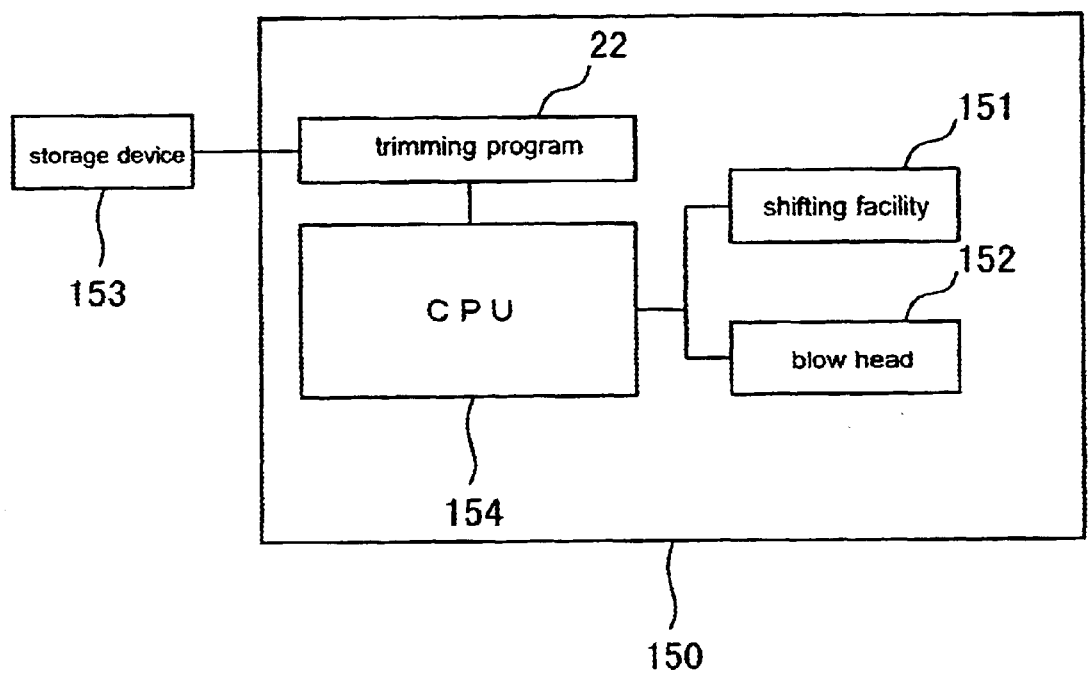
FIG. 9 is a block diagram of a semiconductor device trimming apparatus practiced as a third embodiment of the invention.

The trimming method includes a trimming program creating steps 10 that output a trimming program 22. The trimming program 22 when created is transferred illustratively to a laser trimming apparatus 150 (FIG. 9). The laser trimming apparatus 150 has blowing means 152 for emitting a laser beam to fuse arrays in the semiconductor device. In keeping with the transferred trimming program, the blowing means 152 with its laser beam emission blows designated fuses in a fuse array.

Steps 10 comprise step 11 for counting addresses, step 12 for selecting fuses, step 13 for extracting fuse coordinates, step 14 for arranging the coordinates into a table, and step 15 for creating a program. In step 11, an address signal 16 to be counted is designated and addresses are counted using the designated signal. In step 12, the fuses to be blown are selected on the basis of logic data 18 derived from product design data 17 about the semiconductor device. In step 13, layout data 19 are taken from the product design data 17 on the semiconductor device, and the target fuses selected in step 12 are translated into coordinate data. In step 14, a trimming table 20 is output. The trimming table 20 is a table of correspondence between all address modes and the coordinates of the fuses to be blown corresponding to each address mode. The trimming table 20 is placed into a computer memory. In step 15, the trimming table 20 and program creating rules 21 are obtained, and the trimming program 22 is output.

Figure 2:
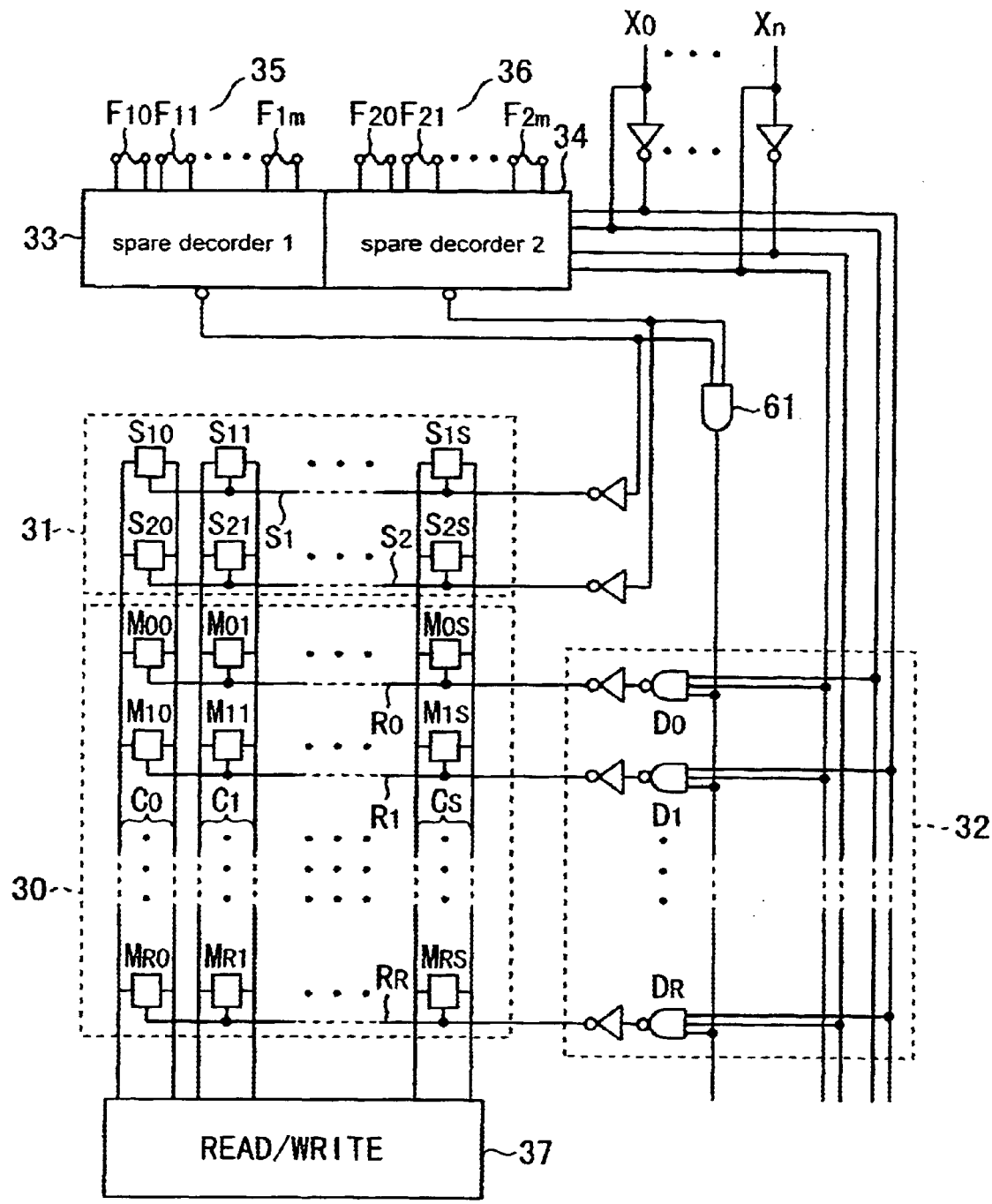
FIG. 2 is a circuit diagram of a typical semiconductor device to be trimmed by the inventive semiconductor device trimming method or by a trimming apparatus according to the invention.

FIG. 2 is a circuit diagram of a typical semiconductor device to be trimmed. By referring to this semiconductor device, the trimming method of FIG. 1 will now be described in more detail. FIG. 2 shows an SRAM which includes a regular memory cell array 30, a spare memory cell array 31, a regular address decoder 32, a first spare decoder 33, a second spare decoder 34, a first fuse array 35, a second fuse array 36, and address signal inputs X0, X1, ... Xn. The regular memory cell array 30 is made of a matrix constituted by a plurality of row lines R0, R1, ... RR ((R+1) lines) and by a plurality of column lines C0, C1, ... CS ((S+1) lines) which is perpendicular to the column lines, the matrix comprising a plurality of SRAM memory cells M00, M01, ... M0S, M10, M11, ... M1S, ... MR0, MR1, ... MRS. The spare memory cell array 31 has at least one row or column spare line carrying a plurality of spare memory cells. This example has two row spare lines S1 and S2 arranged in parallel with the row lines of the regular memory cell array 30. Each of the spare lines carries spare memory cells S10, S11, ... S1S, and S20, S21, ... S2S. The column lines C0, C1, ... CS in the regular memory cell array 30 extend onto the spare memory cell array 31 and are connected to the corresponding spare memory cells on the spare lines S1 and S2. The column lines C0, C1 ... CS are also connected to a read/write circuit 37 that incorporates a column address circuit for selecting column lines and address lines for column line selection.

The regular address decoder 32 has as many individual decoders D0, D1, ... DR as the number of row lines (R+1) in the regular memory cell array 30. The address signal bits X0, X1, ... Xn and their inverted signals combine to make up address modes that are determined in such a manner that different row lines R0, R1, ... RR are selected in each address mode. Given a certain address mode, the corresponding row lines R0, R1, ... RR are selected. The spare decoders 33 and 34 act so as to inhibit the selecting operation of an address decoder corresponding to a row line containing faulty memory cells from among the row lines R0, R1, ... RR, and to replace the inhibited row line with the selected spare line S1 or S2.

The first fuse array 35 and the second fuse array 36 are connected to the spare decoders 33 and 34 respectively. The first and second fuse arrays 35 and 36 have fuses F10, F11, ... F1m ((m+1) fuses) and fuses F20, F21, ... F2m (also (m+1) fuses) respectively. Fuses in the fuse arrays 35 and 36 are blown corresponding to the addresses on that row line in the regular memory cell array 30 which is to be replaced by the spare line S1 or S2.

Figure 3:
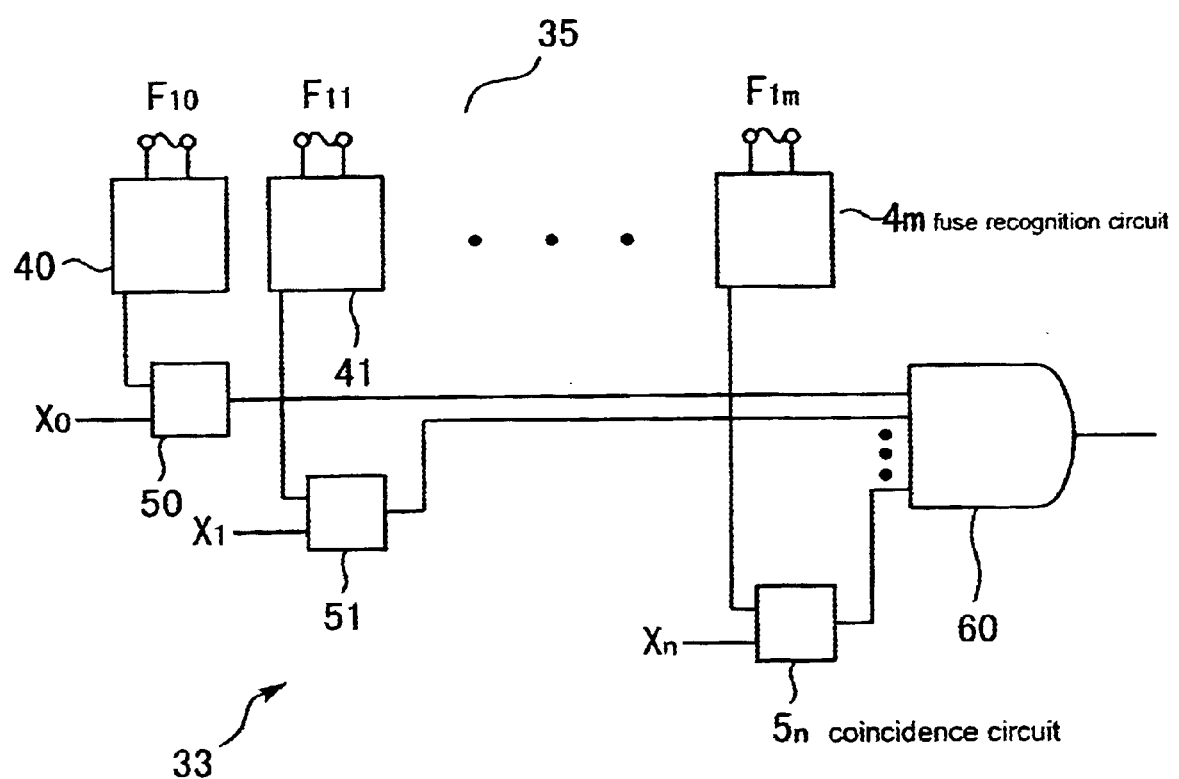
FIG. 3 is a circuit diagram of a spare decoder for use in the circuit of FIG. 2.

FIG. 3 is a circuit diagram showing typical internal circuits of the spare decoder 33. The spare decoder 34 has the same circuit constitution as the spare decoder 33. The spare decoder 33 is used where the number of fuses in the fuse array 35 (as many as (m+1)) is the same as the number of address inputs X0, X1, ... Xn (n+1). The decoder 33 comprises as many fuse recognition circuits 40, 41, ... 4m as the number of the fuses, and as many coincidence circuits 50, 51, ... 5m as the fuse count. The upper input of each of the coincidence circuits 50, 51, ... 5m is fed with the output of each of the fuse recognition circuits 40, 41, ... 4m; the lower input of each coincidence circuit is supplied with the address input X0, X1, ... Xn.

If the fuse array 35 in the semiconductor memory device is blown in a predetermined blow mode and if the coincidence circuits 50, 51, ... 5m have detected an input coincidence in keeping with changes in the address inputs X0, X1, ... Xn, then the decoder 33 in FIG. 3 outputs a "1" through a NAND circuit 60 causing a NAND circuit 61 to output a "1" to inhibit the selecting operation of the corresponding decoder in the regular address decoder 32. At the same time, the output of the NAND circuit 60 activates the corresponding spare line S1 to select the spare memory cells on that spare line S1. This causes the cells on at least one row line in the regular cell array 30 to be replaced with the cells on the spare line. The row line to be replaced in the regular cell array 30 corresponds to the blow mode of the fuse array 35.

The replacing operation discussed above with reference to FIGS. 2 and 3 is already known. According to this invention, with the fuse array 35 yet to be blown, the address signals X0, X1, ... Xn fed to each of the coincidence circuits 50, 51, ... 5m in the spare decoder 33 are monitored illustratively by CAD. The address signals X0, X1, ... Xn constitute varying address modes in which all row lines R0, R1, ... RR can be selected in the regular cell array 30. Since the row line count is currently (R+1), the address mode is varied so that there will be as many address modes as the row line count (R+1). The address modes numbering the same as the row line count amount to all address modes that exist.

Described below in detail with reference to FIGS. 2 and 3 is how to create a trimming table (e.g., Table 1 below) comprising diverse address modes according to the invention, on the assumption that the number of bits representing each address is four. The address bit count being four means that the address signal is made up of four bits, e.g., X3, X2, X1 and X0 where X3 denotes the highest bit and X0 the lowest bit. SPs in the leftmost column of Table 1 each represent an overhead bit indicating which of the spare decoders 33 and 34 is to replace a row line in the regular cell array 30. An SP at "0" points to the spare decoder 33 replacing a row line in the regular cell array 30; an SP at "1" indicates that the spare decoder 34 is to replace a row line in the regular cell array 30.

also exit 16 address modes that are all shown. That means there exist a total of 32 address modes.

Illustratively, suppose now that the address mode regarding a regular row line R0 is constituted by bits X3, X, X1 and X0 being all set to zero as shown in the uppermost address mode field in Table 1 and that the row line R0 is to be replaced by the spare decoder 33. In that case, the bits X3, X2, X1 and X0 constituting an address mode of "0000" correspond to that blow mode of the fuse array 35 in which fuses F13, F12, F11 and F10 are all left intact and only a fuse F14 is to be blown with regard to SP at "0". When the address mode for a regular row line R1 is "0001," that means only the fourth bit X0 is at level 1 and the other bits are all at level 0. The address mode of "0001" for the regular row line R1 corresponds to that blow mode of the fuse array 35 in which the fuses F13, F12 and F11 are left intact and only the fourth fuse F10 is to be blown. In keeping with all address modes except for those of the row lines R0 and R1, the levels of the address signal bits X0, X1, X2 and X3 input to the coincidence circuits 50, 51, 52 and 53 may be monitored by CAD. This provides acquisition of those blow modes for the fuses in the fuse array 35 which correspond to all address modes. This in turn makes it possible to select the fuses to be blown in each address mode as well as the fuses to be blown corresponding to all address modes. The operations involved are carried out by changing the address signal to constitute all address modes through the use of the count address signal 16 shown in FIG. 1.

Trimming Table

| SP | X3 | X2 | X1 | X0 | Coordinates of Fuses to Be Blown |
|---|---|---|---|---|---|
| 0 | 0 | 0 | 0 | 0 | (40. 0, 300. 0) |
| 0 | 0 | 0 | 0 | 1 | (0. 0, 300. 0) (40. 0, 300. 0) |
| 0 | 0 | 0 | 1 | 0 | (10. 0, 300. 0)(40. 0, 300. 0) |
| 0 | 0 | 0 | 1 | 1 | (0. 0, 300. 0) (10. 0, 300. 0)(40. 0, 300. 0) |
| 0 | 0 | 1 | 0 | 0 | (20. 0, 300. 0)(40. 0, 300. 0) |
| 0 | 0 | 1 | 0 | 1 | (0. 0, 300. 0) (20. 0, 300. 0)(40. 0, 300. 0) |
| 0 | 0 | 1 | 1 | 0 | (10. 0, 300. 0)(20. 0, 300. 0)(40. 0, 300. 0) |
| 0 | 0 | 1 | 1 | 1 | (0. 0, 300. 0) (10. 0, 300. 0)(20. 0, 300. 0)(40. 0, 300. 0) |
| 0 | 1 | 0 | 0 | 0 | (30. 0, 300. 0)(40. 0, 300. 0) |
| 0 | 1 | 0 | 0 | 1 | (0. 0, 300. 0) (30. 0, 300. 0)(40. 0, 300. 0) |
| 0 | 1 | 0 | 1 | 0 | (10. 0, 300. 0)(30. 0, 300. 0)(40. 0, 300. 0) |
| 0 | 1 | 0 | 1 | 1 | (0. 0, 300. 0) (10. 0, 300. 0)(30. 0, 300. 0)(40. 0, 300. 0) |
| 0 | 1 | 1 | 0 | 0 | (20. 0, 300. 0)(30. 0, 300. 0)(40. 0, 300. 0) |
| 0 | 1 | 1 | 0 | 1 | (0. 0, 300. 0) (20. 0, 300. 0)(30. 0, 300. 0)(40. 0, 300. 0) |
| 0 | 1 | 1 | 1 | 0 | (10. 0, 300. 0)(20. 0, 300. 0)(30. 0, 300. 0)(40. 0, 300. 0) |
| 0 | 1 | 1 | 1 | 1 | (0. 0, 300. 0) (10. 0, 300. 0)(20. 0, 300. 0)(30. 0, 300. 0)(40. 0, 300. 0) |
| 1 | 0 | 0 | 0 | 0 | (40. 0, 400. 0) |
| 1 | 0 | 0 | 0 | 1 | (0. 0, 400. 0) (40. 0, 400. 0) |
| 1 | 0 | 0 | 1 | 0 | (10. 0, 400. 0)(40. 0, 400. 0) |
| 1 | 0 | 0 | 1 | 1 | (0. 0, 400. 0) (10. 0, 400. 0)(40. 0, 400. 0) |
| 1 | 0 | 1 | 0 | 0 | (20. 0, 400. 0)(40. 0, 400. 0) |
| 1 | 0 | 1 | 0 | 1 | (0. 0, 400. 0) (20. 0, 400. 0)(40. 0, 400. 0) |
| 1 | 0 | 1 | 1 | 0 | (10. 0, 400. 0)(20. 0, 400. 0)(40. 0, 400. 0) |
| 1 | 0 | 1 | 1 | 1 | (0. 0, 400. 0) (10. 0, 400. 0)(20. 0, 400. 0)(40. 0, 400. 0) |
| 1 | 1 | 0 | 0 | 0 | (30. 0, 400. 0)(40. 0, 400. 0) |
| 1 | 1 | 0 | 0 | 1 | (0. 0, 400. 0) (30. 0, 400. 0)(40. 0, 400. 0) |
| 1 | 1 | 0 | 1 | 0 | (10. 0, 400. 0)(30. 0, 400. 0)(40. 0, 400. 0) |
| 1 | 1 | 0 | 1 | 1 | (0. 0, 400. 0) (10. 0, 400. 0)(30. 0, 400. 0)(40. 0, 400. 0) |
| 1 | 1 | 1 | 0 | 0 | (20. 0, 400. 0)(30. 0, 400. 0)(40. 0, 400. 0) |
| 1 | 1 | 1 | 0 | 1 | (0. 0, 400. 0) (20. 0, 400. 0)(30. 0, 400. 0)(40. 0, 400. 0) |
| 1 | 1 | 1 | 1 | 0 | (10. 0, 400. 0)(20. 0, 400. 0)(30. 0, 400. 0)(40. 0, 400. 0) |
| 1 | 1 | 1 | 1 | 1 | (0. 0, 400. 0) (10. 0, 400. 0)(20. 0, 400. 0)(30. 0, 400. 0)(40. 0, 400. 0) |

To the right of the SP column in Table 1 are shown four-bit address modes. When the SP is "0," there are a total of 16 address modes that are listed; when the SP is "1," there The overhead bit SP is used not to select all row lines in the regular cell array 30 but to replace some of them with the spare decoder 33 or 34. Each address is constituted by bits including an overhead bit SP.

According to the method of FIG. 1, logic data 18 such as the number of address bits corresponding to the row lines in the regular cell array 30, the number of spare lines, the number of spare decoders 33 and 34, and the number of fuses included in the fuse arrays 35 and 36 are derived from the product design data 17 about the semiconductor device in question. The logic data 18 are used as a basis for determining the address signal 16 to be counted. In keeping with the address signal 16, addresses are counted successively in step 11. In step 12, the fuses to be blown corresponding to all address modes are selected.

The product design data 17 on the semiconductor device also include layout data 19. The layout data 19 contain physical coordinate data about fuse arrays in the actual product. Generally, the layout data 19 are made up of X and Y coordinate values representing each of the fuses. In step 13, the fuses selected in step 12 for a blowing process are translated into coordinate data. The coordinates are arranged into a table in step 14 whereby a trimming table 20 is created. The trimming table 20 is placed into a storage device. The trimming table 20 is a table of correspondence between addresses and fuse coordinates.

Figure 4:
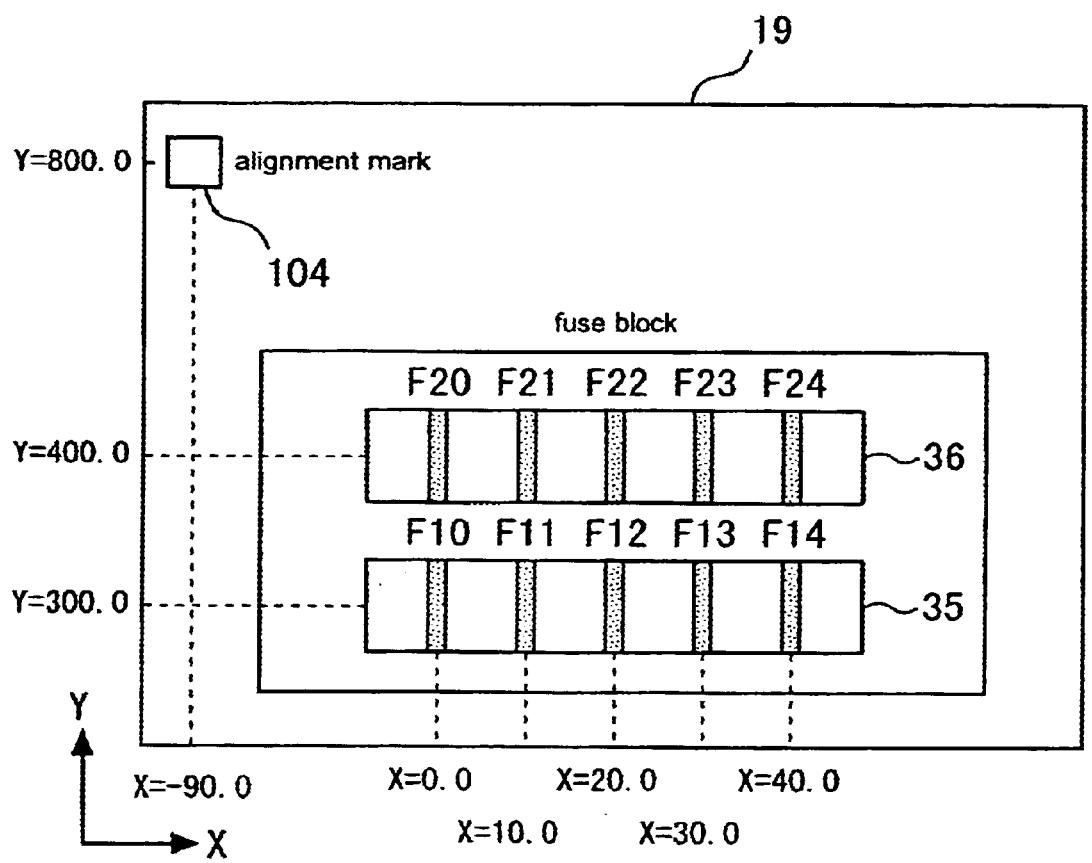
FIG. 4 is a layout view showing typical layout data included in semiconductor device design data.

FIG. 4 shows typical layout data 19. The layout data 19 include the fuse arrays 35 and 36 containing five fuses each. The fuse array 35 has five fuses F10, F11, F12, F13 and F14 laid out a predetermined distance apart. The fuse array 35 has a Y coordinate of 300.0. The fuses in the fuse array 35 have X coordinates of 0.0, 10.0, 20.0, 30.0 and 40.0 respectively. As with the fuse array 35, the fuse array 36 also has five fuses F20, F21, F22, F23 and F24 laid out an equal distance apart. The fuse array 36 has a Y coordinate of 400.0. The fuses in the fuse array 36, as in the fuse array 35, have X coordinates of 0.0, 10.0, 20.0, 30.0 and 40.0 respectively.

Table 1 is a typical trimming table 20 acquired when the above-mentioned layout data 19 are used along with the four-bit address signal also discussed above. In Table 1, SPs are overhead bits not corresponding to the four-bit address signal X0, X1, X2 and X3 but indicating which of the spare decoders 33 and 34 is to effect its replacing function and which of the spare lines S1 and S2 is to be used for the replacement. The fuses F10 and F20 in the fuse arrays 35 and 36 are represented by the overhead bits.

Table 1 lists all 16 address modes in which the spare decoder 33 may effect its replacing function as designated by the four-bit address signal X0, X1, X2 and X3, as well as all 16 address modes in which the spare decoder 34 may exercise its replacing function as specified by the address signal. On the left-hand side of the table, the coordinates of the fuses to be blown corresponding to the respective address modes are indicated. These coordinates are structured as shown in FIG. 4. The trimming table 20 exemplified by Table 1 shows the coordinates of the fuses to be blown to replace any one of all 16 row lines R1, R2, . . . RR by the spare line S1 in all 16 address modes, as well as the coordinates of the fuses to be blown in order to replace any one of all 16 row lines R1, R2, . . . RR by the spare line S2 in all 16 address modes.

In step 15 of FIG. 1, the program creating rules 21 as well as the trimming table 20 are acquired in order to create a trimming program 22. FIG. 5 depicts typical program creating rules 21, indicating a structure of a repair code 23 substituting for the spare line S1 or S2 and a command for a trimming apparatus A in charge of the repair. As shown in FIG. 5, the repair code 23 is a 16-bit code that includes code bits SP, X0, X1, X2 and X3 shown in Table 1. The other bits contain the coordinates of chips on a wafer.

Figure 6:
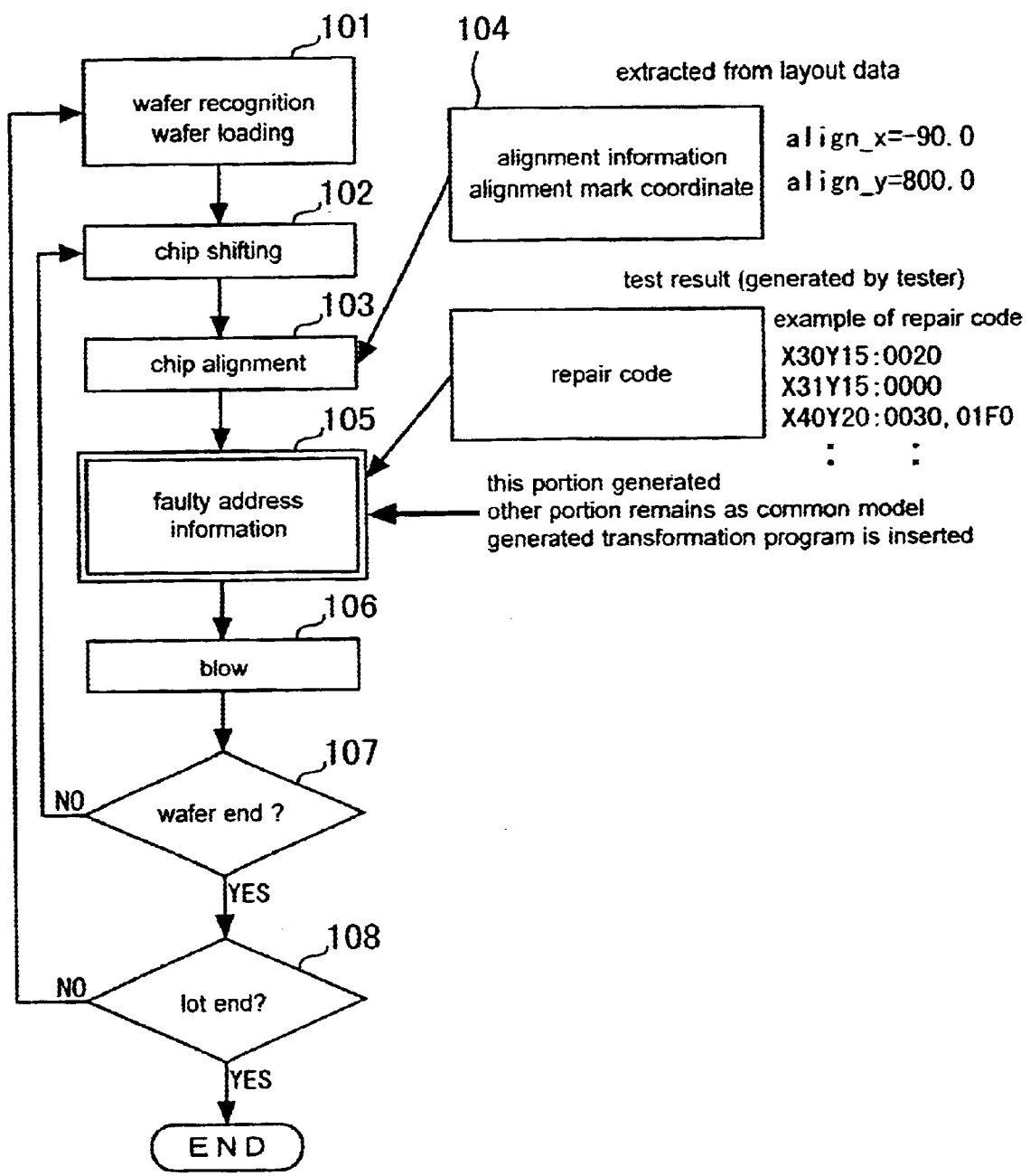
FIG. 6 is a flowchart of more steps constituting the inventive semiconductor device trimming method.

FIG. 6 is a flowchart of more steps constituting a trimming process including translation of the trimming table 20 into the trimming program 22. In step 101, the wafer is recognized and loaded into the trimming apparatus. In step 102, the chips are shifted and a check is made to see if a target chip is in position. In step 103, an alignment mark 104 attached to the chip is captured for use. The alignment mark 104, included in the layout data 19 of FIG. 19, has a Y coordinate of 800.0 and an X coordinate of −90.0. These coordinates are used to position the chip where appropriate. In that state, step 105 is reached and the trimming table 20 is put to use. In step 105, the chip is tested so that faulty address information covering defective cells is acquired and the repair code 23 shown in FIG. 5 is obtained. The faulty address information is translated into coordinate data representing the fuses to be blown, and the coordinate data are integrated into the program.

In step 106 of FIG. 6, the selected fuses are blown by the trimming apparatus. The step involves the use of a laser beam to blow the fuses whose coordinates are designated by the program. In step 107, a check is made to see if the wafer has been exhausted. In step 108, a check is made to see if the lot has been exhausted. If the result of the check in step 107 and the result in step 108 are both negative, the chips are shifted again and the blowing process is repeated on another chip.

Although the semiconductor device shown in FIG. 2 is an SRAM, this is not limitative of the invention. The invention also applies to other semiconductor devices made of DRAMs or a plurality of cells arranged in a matrix wherein a faulty line is replaced by a spare line. Whereas the semiconductor device in FIG. 2 has two spare lines in parallel with the row lines in the regular cell array 30, the invention also applies to setups having at least one spare line in parallel with the column lines of the regular cell array, as well as to setups having at least one spare line in parallel with the row lines of the regular cell array and at least one spare line in parallel with the column lines of the same array.

According to the inventive trimming method described above, a trimming table is created in a generalized manner for use with diverse kinds of semiconductor devices wherein a faulty line in a regular cell array may be replaced by a spare line. A trimming program is created automatically and the time required for trimming is reduced significantly.

Figure 7:
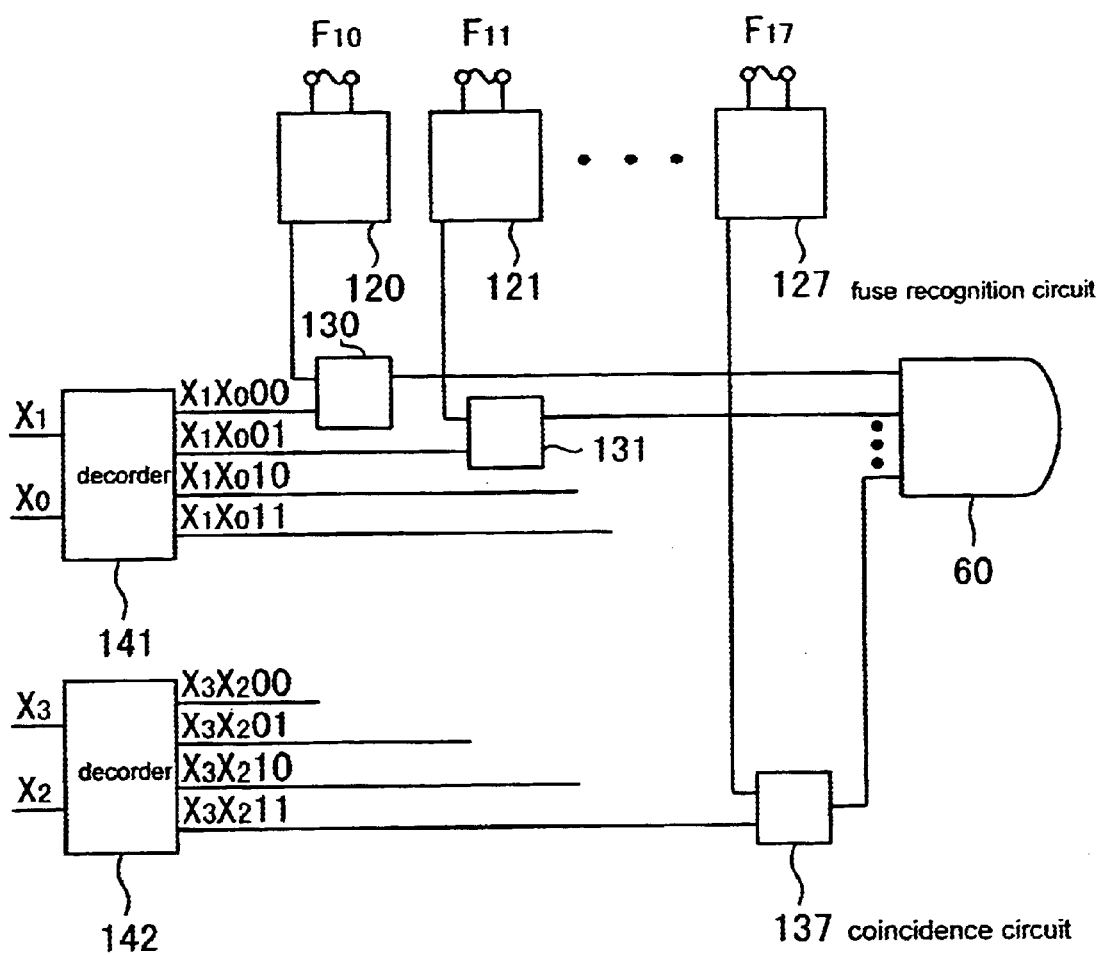
FIG. 7 is a circuit diagram of another spare decoder for use in the circuit of FIG. 2.

FIG. 7 shows another typical structure constituting the spare decoders 33 and 34. In this example, the spare decoders 33 and 34 each have eight fuses connected thereto for a total of 16 fuses. In FIG. 7, eight fuses F10, F11, . . . F17 are shown connected to the spare decoder 33. These fuses are connected respectively to fuse recognition circuits 120, 121, . . . 127 and to coincidence circuits 130, 131, . . . 137. Two decoders 141 and 142 are utilized. The decoder 141 admits address signal bits X0 and X1 out of the four-bit address signal X0, X1, X2 and X3.

The decoder 141 effects four outputs "X1 X0 0 0," "X1 X0 0 1," "X1 X0 1 0" and "X1 X0 1 1." The output of "X1 X0 0 0" is at level 1 when both X1 and X0 are at level 0; the output of "X1 X0 0 1" is at level 1 when X1 is at level 0 and X0 at level 1; the output of "X1 X0 1 0" is at level 1 when X1 is at level 1 and X0 at level 0; and the output of "X1 X0 1 1" is at level 1 when both X1 and X0 are at level 1.

In the product whose fuses are blown selectively, the coincidence circuits 130, 131, 132 and 133 act to replace a faulty line in the regular cell array 30 with the spare line S1 on detecting coincidence of the recognition circuits 120, 121, 122 and 123 for the fuses F10, F11, F12 and F13. With any fuses yet to be blown, the four output levels of the decoder 141 may be monitored illustratively by CAD while the address signal bits X1 and X0 are being changed to make up all address modes. This permits selection of the fuses to be blown in each of the address modes. Likewise, the levels of four outputs "X3 X2 0 0," "X3 X2 0 1," "X3 X2 1 0" and "X3 X2 1 1" may be monitored while the address signals bits X3 and X2 are being changed to constitute all address modes. This similarly provides selection of the fuses to be blown in each of the address modes.

Where the spare decoders 33 and 34 of FIG. 7 are used, the outputs of the decoders 141 and 142 correspond to the fuses to be blown as follows:

F10, F20 to be blown with the output of "X1 X0 0 0"
F11, F21 to be blown with the output of "X1 X0 0 1"
F12, F22 to be blown with the output of "X1 X0 1 0"
F13, F23 to be blown with the output of "X1 X0 1 1"
F14, F24 to be blown with the output of "X3 X2 0 0"
F15, F25 to be blown with the output of "X3 X2 0 1"
F16, F26 to be blown with the output of "X3 X2 1 0"
F17, F27 to be blown with the output of "X3 X2 1 1"

Because values of X1, X0 and values of X3, X2 combine to make up address modes in practice, two fuses are selected in each address mode and another two are selected in the spare decoders for a total of four fuses to be blown.

Where the spare decoders of FIG. 7 are used, the fuses to be blown in each of all address modes are selected in like manner and the selected fuses are translated into fuse coordinates constituting a trimming table that is similar to Table 1.

When a faulty line is replaced by use of the spare decoders of FIG. 7, overhead bits SP are also needed to indicate which of the two spare decoders is used for the replacement.

Second Embodiment

Figure 8:
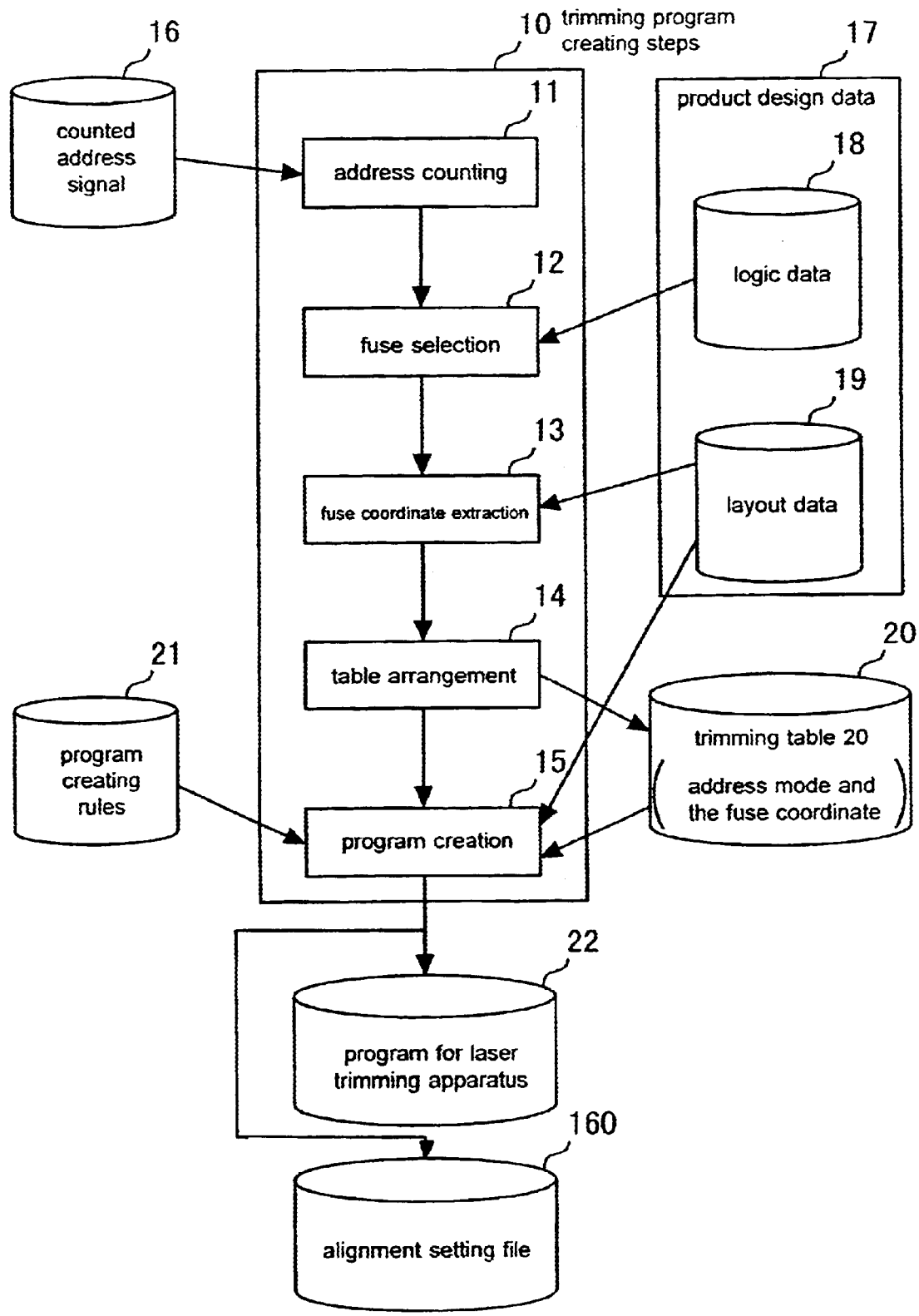
FIG. 8 is a flowchart of steps constituting a semiconductor device trimming method practiced as a second embodiment of the invention.

FIG. 8 is a flowchart of steps constituting a semiconductor device trimming method practiced as the second embodiment, i.e., a modification of the trimming method described above as the first embodiment. With the second embodiment, the trimming program creating steps 10 create not only the trimming program 22 but also an alignment setting file 160. The layout data 19 acquired in step 13 of FIG. 1 include the alignment mark 104 shown in FIG. 4. With the second embodiment, the alignment mark 104 is also obtained during program preparation in step 15. The alignment coordinates are used concurrently to create the alignment setting file 160 for wafer alignment and die alignment.

According to the second embodiment in FIG. 8, the alignment setting is part of programs prepared for the laser trimming apparatus. Creating the alignment setting file eliminates the need for manual preparation of an alignment setting program. This reduces programming mistakes and shortens the time required for programming.

Third Embodiment

FIG. 9 is a block diagram of a semiconductor device trimming apparatus 150 which, practiced as the third embodiment of the invention, uses the trimming method of the first or the second embodiment to trim semiconductor devices. The trimming apparatus 150 includes a trimming program 22 and comprises a wafer and chip shifting facility 151 and a blow head 152. The program 22 is created using a storage device 153 that contains the trimming table 20. In accordance with a trimming program 22, a CPU 154 of the apparatus drives the shifting facility 151 and blow head 152.

Now, the effects and advantages of the present invention may be summarized as follows.

As described, a semiconductor device trimming method according to the invention provides preparation of a trimming table that ensures correspondence between all address modes relevant to faulty cell replacement on the one hand and the coordinates of the fuses to be blown in each of the address modes on the other hand. The method permits creation of a trimming program in a simplified and generalized fashion for easy trimming work.

In another aspect, a semiconductor device trimming apparatus according to the invention is furnished with storing means that accommodates a trimming table ensuring correspondence between all address modes relevant to faulty cell replacement on the one hand and the coordinates of the fuses to be blown in each of the address modes on the other hand. The trimming table is used to carry out necessary trimming work with ease.

According to another aspect, a semiconductor device trimming method according to the invention provides preparation of not only the trimming program but also an alignment setting file through the use of the trimming table. The method simplifies not only the trimming process but also the alignment setting process.

According to another aspect, a method for creating a trimming table according to the invention monitors signals of logic circuits contained in spare decoders of a semiconductor device. The monitoring process readily ensures correspondence between all address modes relevant to faulty cell replacement on the one hand and the coordinates of the fuses to be blown in each of the address modes on the other hand. This makes it possible to simplify the trimming process even as it is performed in a generalized fashion.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2000-220608, filed on Jul. 21, 2000 including specification, claims, drawings and summary, on which the Convention priority of the present application is based, are incorporated herein by reference in its entirety.

What is claimed is:

1. A semiconductor device trimming method for use with a semiconductor device:

said semiconductor device including:

a regular cell array having a plurality of cells arranged in a matrix constituted by a plurality of first lines and by a plurality of second lines intersecting said first lines;

first address lines for selecting cells on each of said first lines in said regular cell array;

second address lines for selecting cells on each of said second lines in said regular cell array;

a spare cell array having a plurality of cells arranged on at least one spare line corresponding to said first lines;

a fuse array including a plurality of fuses; and a spare decoder which, connected to said fuse array, inhibit selection of cells on at least one of said first lines in said regular cell array in accordance with blow modes of said fuse array and which permit selection of cells on at least one of said spare lines in said spare cell array in order to replace the inhibited first line;

said semiconductor device trimming method being used selectively to blow fuses so as to impart said blow modes to said fuse array, said method comprising the steps of:

preparing a trimming table which lists all address modes of address signals for said first address lines and the blow mode of said fuse array corresponding to each of the address modes; and selectively blowing fuses in said fuse array according to the blow mode corresponding to at least one of said first lines of which the selection has been inhibited in said regular cell array in accordance with said trimming table.

2. The semiconductor device trimming method according to claim 1, wherein said first lines are row lines, said second lines are column lines, said first address lines are row address lines, and said second address lines are column address lines.

3. The semiconductor device trimming method according to claim 1, wherein said first lines are column lines, said second lines are row lines, said first address lines are column address lines, and said second address lines are row address lines.

4. The semiconductor device trimming method according to claim 1, wherein said trimming table comprises coordinates of those fuses in said fuse array which correspond to each of all said address modes.

5. The semiconductor device trimming method according to claim 1, further comprising the step of creating both a trimming program and an alignment setting file by use of said trimming table.

6. A trimming table creating method for use with a semiconductor device:

said semiconductor device including:

a regular cell array having a plurality of cells arranged in a matrix constituted by a plurality of first lines and by a plurality of second lines intersecting said first lines;

first address lines for selecting cells on each of said first lines in said regular cell array; second address lines for selecting cells on each of said second lines in said regular cell array;

a spare cell array having a plurality of cells arranged on at least one spare line corresponding to said first lines;

a fuse array including a plurality of fuses; and a spare decoder which, connected to said fuse array, inhibit selection of cells on at least one of said first lines in said regular cell array in accordance with blow modes of said fuse array and which permit selection of cells on at least one of said spare lines in said spare cell array in order to replace the inhibited first line;

said trimming table creating method being used to create a trimming table for selectively blowing fuses so as to impart said blow modes to said fuse array, the method comprising the step of monitoring outputs of logic circuits included in said spare decoder, thereby preparing a trimming table which lists all address modes of address signals for said first address lines and the blow mode of said fuse array corresponding to each of the address modes.

7. The trimming table creating method according to claim 6, wherein said trimming table comprises coordinates of those fuses in said fuse array which correspond to each of all said address modes.

* * * * *

UNITED STATES PATENT AND TRADEMARK OFFICE
CERTIFICATE OF CORRECTION

PATENT NO.     : 6,658,637 B2
DATED          : December 02, 2003
INVENTOR(S)    : Yasuhiko Fukushima et al.

It is certified that error appears in the above-identified patent and that said Letters Patent is hereby corrected as shown below:

<u>Title page,</u>
Item [73], Assignee, change "Mitsubishi Denki Kabushiki Kaisha" to -- Renesas Technology, Corp. --.

Signed and Sealed this

Thirteenth Day of July, 2004

JON W. DUDAS
*Acting Director of the United States Patent and Trademark Office*